United States Patent [19]
Ching

[11] Patent Number: 6,094,368
[45] Date of Patent: Jul. 25, 2000

[54] AUTO-TRACKING WRITE AND READ PROCESSES FOR MULTI-BIT-PER-CELL NON-VOLATILE MEMORIES

[75] Inventor: Wong Sau Ching, Hillsborough, Calif.

[73] Assignee: Invox Technology, Campbell, Calif.

[21] Appl. No.: 09/262,946

[22] Filed: Mar. 4, 1999

[51] Int. Cl.[7] .............................. G11C 15/00; G11C 16/04
[52] U.S. Cl. .................. 365/49; 365/185.03; 365/185.11
[58] Field of Search ................................ 365/49, 185.03, 365/185.11

[56] References Cited

U.S. PATENT DOCUMENTS

| | | | |
|---|---|---|---|
| 5,450,351 | 9/1995 | Heddes ........................................ | 365/49 |
| 5,859,791 | 1/1999 | Schultz et al. .............................. | 365/49 |
| 5,905,668 | 5/1999 | Takahashi et al. .......................... | 365/49 |
| 5,946,704 | 8/1999 | Yoneda et al. .............................. | 365/49 |

*Primary Examiner*—Trong Phan
*Attorney, Agent, or Firm*—Skjerven, Morrill, MacPherson, Franklin & Friel LLP; David T. Millers

[57] ABSTRACT

A multi-bit-per-cell memory includes a memory array having reference cells and storage cells, a read circuit, a content addressable memory, and an encoder. When data is written to the memory, a set of reference values for the write are written to the reference cells. The reference values correspond to the multi-bit digital values that can be stored in a single storage cell. For a read operation, the read circuit reads the reference values from the reference cells and stores the reference values in the content addressable memory. The read circuit then reads a data value from a storage cell associated with the reference values and applies the value read to the content addressable memory for a match operation. The output data is equal to the number or address of the entry containing the reference value that matches the data value. Since the reference and data values are written at approximately the same time and read at approximately the same time, any variations in the reference cells performance automatically tracks the performance of the storage cell. Thus, the output data value is correct even though the values that the read circuit reads from the reference and storage cells vary according to the history and current operating parameters of the memory. Write processes for the reference cells improve reference cell endurance by changing either a mapping between digital values and threshold voltages or a mapping between digital values and reference cells. A look-up table in the encoder can be re-written when the mapping between digital values and reference cells changes.

30 Claims, 7 Drawing Sheets

AUTO-TRACKING WRITE AND READ PROCESSES FOR MULTI-BIT-PER-CELL NON-VOLATILE MEMORIES

BACKGROUND

1. Field of the Invention

This invention relates to multi-bit-per-cell memory and to read and write processes for multi-bit-per-cell memory

2. Description of Related Art

Conventional non-volatile memory such as a flash memory has memory cells that include floating gate transistors. Each floating gate transistor stores data as charge trapped on an isolated floating gate. The trapped charge in a floating gate transistor determines the threshold voltage of the floating gate transistor, and thus data can be written in or read from a memory cell by setting or determining the threshold voltage of the floating gate transistor in the memory cell. If the methods for setting and determining the threshold voltages are sufficiently accurate and dependable, multiple bits of data can be stored in each memory cell.

One difficulty encountered when attempting to set or determine a threshold voltage with the accuracy required for multi-bit-per-cell storage is variations in operating parameters such as the temperature and supply voltage of the memory. If the operating parameters of the memory during a read differ from the operating parameters when the data was written, the threshold voltage read from a memory cell can differ from the threshold voltage as written. Accordingly, a multi-bit-per-cell memory must account for the variations in operating parameters to avoid data errors. Additionally, charge leakage from the floating gate, memory cell disturb, and endurance history (i.e., the number of write and erase cycles for a memory cell) affect a memory cell's characteristics and can change the threshold voltage of the memory cell. One conventional way to account for variations in operating parameters, charge leakage, and endurance history is to use for each data value, a band of threshold voltages that is sufficiently wide to cover the anticipated variations in the threshold voltages read. However, since the full usable range of threshold voltages of a memory cell is limited, having wide bands for each data value reduces the number of bits that can be stored per memory cell. Accordingly, a multi-bit-per-cell memory is sought that accurately accounts or compensates for variations in operating parameters and reliably provides a maximum number of bits per memory cell.

SUMMARY

In accordance with the invention, a multi-bit-per-cell memory includes a memory array having reference cells and storage cells. The memory also contains a read circuit, a content addressable memory (CAM), and an encoder. When data are written to the memory, a set of predetermined reference values is written (or programmed) into the reference cells. The reference values correspond to every multi-bit digital value that a single storage cell can store, and each portion of the array containing storage cells has a set of reference cells to which the reference values are written at about the same time that data is written into the storage cells. For a read operation, the read circuit reads the reference values from the reference cells and stores the reference values in the CAM. The read circuit then reads a data value from a storage cell and applies the data value to the CAM for a match operation. A signal from the CAM to the encoder indicates which entry of the CAM matches the data, and the encoder generates an output data signal that indicates the number for the entry containing the reference value that matches the data value. Since the reference cells and storage cells are written at approximately the same time and read at approximately the same time, the reference cells' performance tracks the performance of the storage cells. Thus, the output data value from the encoder is correct even though the values that the read circuit reads from the reference and storage cells vary with the operating parameters and history of the memory. Additionally or alternatively, the CAM and encoder can non-linearly map threshold voltages to multi-bit data values.

One multi-bit-per-cell memory in accordance with an embodiment of the invention includes: an array of memory cells including reference and storage cells; a read circuit; a content addressable memory; and an encoder. The read circuit connects to the array for reading any selected memory cell (i.e., storage or reference cell) of the array. The CAM, which couples to the read circuit, stores reference values that the read circuit reads from the reference cells. The CAM also performs match operations on values that the read circuit reads from storage cells. The encoder, which couples to the CAM, generates a data output value indicating which entry in the CAM matches a value read from a storage cell.

The memory cells are typically non-volatile memory cells including floating gate devices, and in a read operation, the read circuit typically generates a digital value corresponding to a threshold voltage of the memory cell. However, aspects of the invention apply to other multi-bit-per-cell memory such as DRAM where a memory cell contains a capacitor charged to a level representing multiple bits of data.

In accordance with another aspect of the invention, the read circuit when reading a memory cell generates a digital value containing more bits than are in the data output value. Accordingly, digital values read from a cell may drift from one reading to the next because of variations in the operating parameters of the memory or because of the use and history of the memory. However, the reference cells drift in the same manner as the storage cells so that reference cells and storage cells automatically track each other. The output data value depends on which of the reference cells matches the storage cell and not on the absolute value initially read from the storage cell. Accordingly, the output data is independent of the drift and is the same as the multi-bit data originally written.

In accordance with another embodiment of the invention, a method for operating a multi-bit-per-cell memory, includes: reading a first set of reference values from a first set of reference cells; writing the first set of reference values to entries in a content addressable memory; reading a first multi-bit digital value from a first storage cell; using the content addressable memory to determine which of the entries stores a reference value that matches the first multi-bit digital value; and generating an output data signal having a value that corresponds to or identifies the entry determined to match the first multi-bit digital value. Optionally, the method further includes the initial steps of: erasing a sector of memory cells including the first set of reference cells and the first storage cell; programming the first set of reference cells to levels indicating the first set of reference values; and programming storage cells in the sector, wherein programming the reference cells and programming the storage cells are conducted without other intervening operations of the memory. A second storage cell that corresponds to the same set of reference cell and resides in the same portion or sector of the memory as the first storage cell can be read and converted using the same set of reference values in the CAM. For a second storage cell that is in a different portion or sector of the memory or written later than the first storage cell, a second set of reference values from a second set of reference cells can be loaded into the CAM for optimal tracking and matching with the value from the second storage cell.

In accordance with another aspect of the invention, methods for writing reference cells in a non-volatile multi-bit-per-cell memory improve endurance of the reference cells when compared to writing the same threshold voltage to a reference cell every time the reference cell is programmed. In accordance to one embodiment of the invention, a method for operating a multi-bit-per-cell non-volatile memory performs a first write operation that writes a set of reference values to a set of reference cells in the memory. A first mapping maps threshold voltages to the reference values, and the first write operation programs each reference cell to the threshold voltage that the first mapping maps to the reference value written in the reference cell. If the reference cells are later erased and rewritten, a second write operation writes the set of reference values to the set of reference cells, but for the second write operation, a second mapping maps threshold voltages to the reference value. The second write operation programs each reference cell to the threshold voltage that the second mapping maps to the reference value written in the reference cell. Since no reference cell is repeatedly programmed to the same threshold voltage level, the endurance of the reference cells are enhanced.

In accordance with another embodiment of the invention, a method for operating a multi-bit-per-cell non-volatile memory writes a set of reference values to a set of reference cells in the memory. A first mapping maps the reference values to the reference cells, and the writing programs each reference cell to a threshold voltage associated with the reference value that the first mapping maps to the reference cell. The memory includes a re-writeable look-up table, and the reference values are written in entries of the look-up table. Each entry comprises corresponds to one of the reference cell, and the reference value written in an entry is the reference value that the first mapping maps to the reference cell corresponding to the entry. A read operation then reads the reference cells, reads a storage cell, and compares a result from reading the storage cell with results from reading the reference cells. An output value representing a multi-bit data read from the storage cell is the reference value read from the entry of the look-up table that corresponds to the reference cell providing a result matching the result from the storage cell. Reference values can be randomized in any desired manner among the reference cells each time the reference cells are programmed. The output value from a read operation will still correctly identify data if the entries of the look-up table contain the same reference values as the corresponding reference cell.

A re-writeable look-up table in the memories as described above also permits use of the encoder to decrypt an encrypted data sequence. In particular, an embodiment of the invention is a method including: writing an encrypted data sequence to storage cells; storing values in a content addressable memory; reading a selected one of the storage cells and applying a result from the reading to the content addressable memory for a match operation; and applying a match signal from the content addressable memory to a look-up table. The match signal selects an entry of the look-up table, and the selected entry corresponds to an entry in the content addressable memory that matches the applied result from reading the selected storage cell. After an entry is selected, a value from the selected entry of the look-up table is output. The values in the look-up table are selected for decrypting data read from the selected storage cell and can be changed according to the encryption method used to encrypt the data and a user-provided encryption code. If the user fails to provide the correct encryption code, a read operation does not properly decrypt the data.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with an aspect of the invention, a non-volatile memory such as a multi-bit-per-cell flash memory includes multiple memory arrays or banks with each memory bank containing multiple sectors with reference cells and storage cells. Before first writing data to a sector in a memory bank after erasing the sector, the values that a single memory cell can store are written into a set of reference cells in the sector. For example, when each memory cell can store an N-bit value, there are at least one set of $2^N$ reference cells per sector, and values 0 to $2^N-1$ are written in $2^N$ reference cells when first writing to a sector. Alternatively, the reference values can be written to reference cells after writing data or in an interleaved fashion while writing data.

A read circuit for the memory includes a threshold voltage (Vt) read circuit, a content addressable memory, and an encoder. The Vt read circuit has a range of digital output values that is equal to or greater than the range of digital values that can be stored in a memory cell. For example, if each memory cell can store an N-bit value, the Vt read circuit reads out digital values having N+M bits where M is equal to or greater than zero. When reading from a sector, the Vt read circuit first reads from the reference cells in the sector and writes the N+M-bit values to the content addressable memory. The Vt read circuit then reads a storage cell and applies an N+M-bit value to the content addressable memory. The matching one of the $2^n$ values in the content addressable memory identifies the stored value, and the encoder outputs a digital value according to which reference value in the content addressable memory matches the value that the Vt read circuit read. From one read operation to the next, the output values of the Vt read circuit can change because of changes in temperature, supply voltage, disturb and charge leakage of cells in the array, and endurance history, for example. However, since the reference cells are identical to the storage cells and written at approximately the same time, the variations of values read from reference and storage cells track each other so that the output data is independent of the variations.

Figure 1:
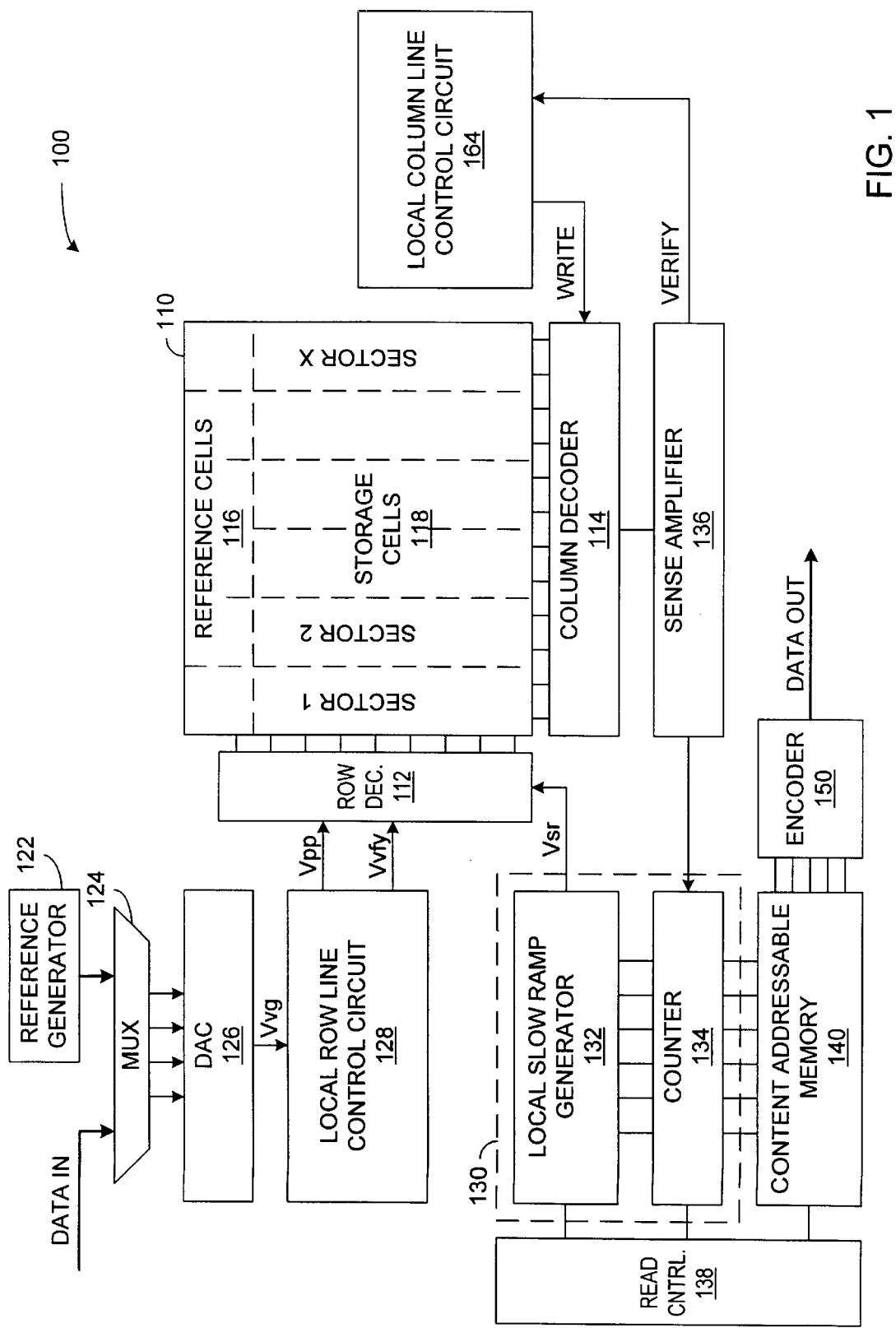
FIG. 1 is a block diagram of a non-volatile memory in accordance with an embodiment of the invention.

FIG. 1 is a block diagram of a portion of a multi-bit-per-cell memory 100 having autotracking in accordance with an embodiment of the invention. Memory 100 includes multiple memory arrays or banks 110 of memory cells, but for ease of illustration FIG. 1 shows only one memory bank 110. In an exemplary embodiment, memory 100 includes 64 memory banks 110 that are adapted for pipelined read and write operations such as described in U.S. Pat. No. 5,680,341, entitled "Pipelined Record and Playback for Analog Non-Volatile Memory"; U.S. Pat. No. 5,969,986, entitled "High-Bandwidth Read and Write Architectures for Non-Volatile Memories"; and U.S. patent application Ser. No. 09/128,225, entitled "High Data Rate Write Process for Non-Volatile Flash Memories" which are hereby incorporated by reference herein in their entirety. Each memory bank 110 is an array of multi-bit-per-cell memory cells such as an array of floating stacked-gate or split-gate floating gate Flash memory cells wherein a programmable threshold voltage of each memory cell represents an N-bit value. Alternatively, other types of multi-bit-per-cell memory cells such as EEPROM or DRAM cells might be employed. In an exemplary embodiment, each memory cell stores a 4-bit value, and the values that can be stored in a single memory cell are 0 to 15. Each memory cell in bank 110 is either a reference cell 116 or a storage cell 118. (Although FIG. 1 shows reference cells 116 at an edge of array 110, reference cells 116 can be located in array 110 and can be dispersed among storage cells 118.) Reference cells 116 and storage cells 118 have the same structure but different uses. Storage cells 118 store data with one N-bit data value per storage cell. Reference cells 116 store reference values that represent the N-bit data values. An autotracking read process uses reference cells 116 as described further below when reading data from a storage cell 118.

Memory bank 110 has a Flash array architecture and includes one or more erasable sectors. In the exemplary embodiment of the invention, each sector includes eight columns of memory cells. To erase a sector in array 110, a row decoder 112 grounds the row lines of bank 110, a column decoder 114 causes the column lines of the sector to float, and a local charge pump 162 charges a source line for the sector to an erase voltage Verase (typically about 10–12 volts). Alternatively, a negative-gate erase process applies a negative control gate voltage of about −8 to −10 volts while the source line for the sector being erased is at +5 to +6 volts. After an erase, a sector can be prepared for writing of data by first writing a set of reference values to the reference cells 116 in the sector. The reference values written include each of the values from the range of digital values that can be stored in one of storage cells 118. For example, a sector initialization process writes values 0 to 15 to sixteen reference cells in the exemplary embodiment. More reference cells are required for memories storing more bits per memory cell. For example, an 8-bit-per-cell memory uses 256 memory cells to store values 0 to 255. Since the exemplary embodiment includes eight columns of memory cells per sector, two rows of memory cells and two row lines of array 110 are dedicated to provide sixteen reference cells 116. The row lines dedicated to reference cells 116 are outside the user addressing scheme for storage cells 118. Reference cells 116 accordingly do not have addresses in the address space for data but have row lines that a row decoder 112 selects when a read control circuit 138 indicates an access of reference cells 116. Immediately after the reference values are written to reference cells 116 in a sector, data can be written to the storage cells 118 of the sector.

Write circuitry for memory bank 110 including a digital-to-analog converter (DAC) 126, a local row line control circuit 128, and a local charge pump writes the reference values in reference cells 116 and data in the storage cells 118. For the reference values, a reference generator 122 generates the series of digital reference values, and an input multiplexer 124 selects digital reference values for writing. In the write process, DAC 126 converts the digital values from multiplexer 124 to a global verify voltage Vvg that depends on the multi-bit value being written. Global verify voltage Vvg identifies the target threshold voltage to be written to a memory cell. In one embodiment of the invention, DAC 126 provides global verify voltage Vvg with a voltage level (typically between about 2 and 6 volts) that is within the threshold voltage range of the memory cells. DAC 126 can be implemented as a conventional linear DAC with a level shifter that shifts the output signal Vvg to an appropriate level indicating a target threshold voltage to be written. Alternatively, DAC 126 can perform a non-linear conversion, for example, such that high target threshold voltages are more widely separated than are the lower target threshold voltages. Additionally, DAC 126 can implement a conversion including Grey coding such that any two consecutive verify voltages Vvg from DAC 126 correspond to digital values that differ in only a single bit and are not necessarily consecutive digital values.

In accordance with another aspect of the invention, DAC 126 can implement several alternative conversions from digital input values to output global verify voltages Vgv, and DAC 126 can switch from one conversion to another each time a sector is erased This has the advantage of changing the threshold voltage associated with each data value. As described further below, reference cells 116 have location associated with multi-bit digital values and in some embodiments of the invention, are always programmed to the threshold voltage corresponding to the associated multi-bit digital value. Writing the same high (or low) threshold to the same reference can lead to endurance problems and can change the characteristics of some reference cells 116. Changing the conversion of DAC 126 changes the threshold voltages written to reference cells 116 and reduces the endurance problem. Alternatively, as described further below, the locations of reference cells 116 can change, rotate, or shift every write cycle.

Local row line control circuit 128 generates write voltages Vpp Vvfy that row decoder 112 applies the row line coupled to a programmed. The verify voltage Vvfy is typically the same as the global verify voltage Vvg that generator 128 samples when directed to begin a write operation. Row decoder 112 applies write voltage Vpp (typically between about 6 and 12 volts) to the selected row line during a series of programming pulses and applies verify voltage Vvfy to the selected row line during a series of verify cycles. Row decoder 112 grounds the unselected row lines for both programming pulses and verify cycles. During the programming pulses, column decoder 114 applies a programming voltage Vw (typically between about 4 and 6 volts) from the charge pump to the selected column line associated with the memory cell being programmed. The combination of the row line programming voltage Vpp on the control gate (or row line) of the selected memory cell, the column line programming voltage Vw on the drain (or column line) of the selected memory cell, and the grounded source of the selected memory cell causes channel hot electron injection that injects electrons into the floating gate of the selected memory cell. Accordingly, the threshold voltage of the selected memory cell rises during each programming pulse.

During each verify cycle, row decoder 112 applies verify voltage Vvfy to the control gate of the selected memory cell, and column decoder 114 applies a read voltage Vr (typically about 1 volt) to the selected column line and connects a sense amplifier 136 to the selected column line. If the threshold voltage of the selected memory cell is below the target level (i.e., below verify voltage Vvfy), the selected memory cell conducts during the verify cycle, and sense amplifier 136 asserts a signal indicating that programming pulses should continue. When a programming pulse raises the threshold voltage of the selected memory cell to or above the target threshold voltage that verify voltage Vvfy indicates, the selected memory does not conduct during the following verify cycle, and sense amplifier 136 asserts a signal to stop further programming pulses.

Figure 2:
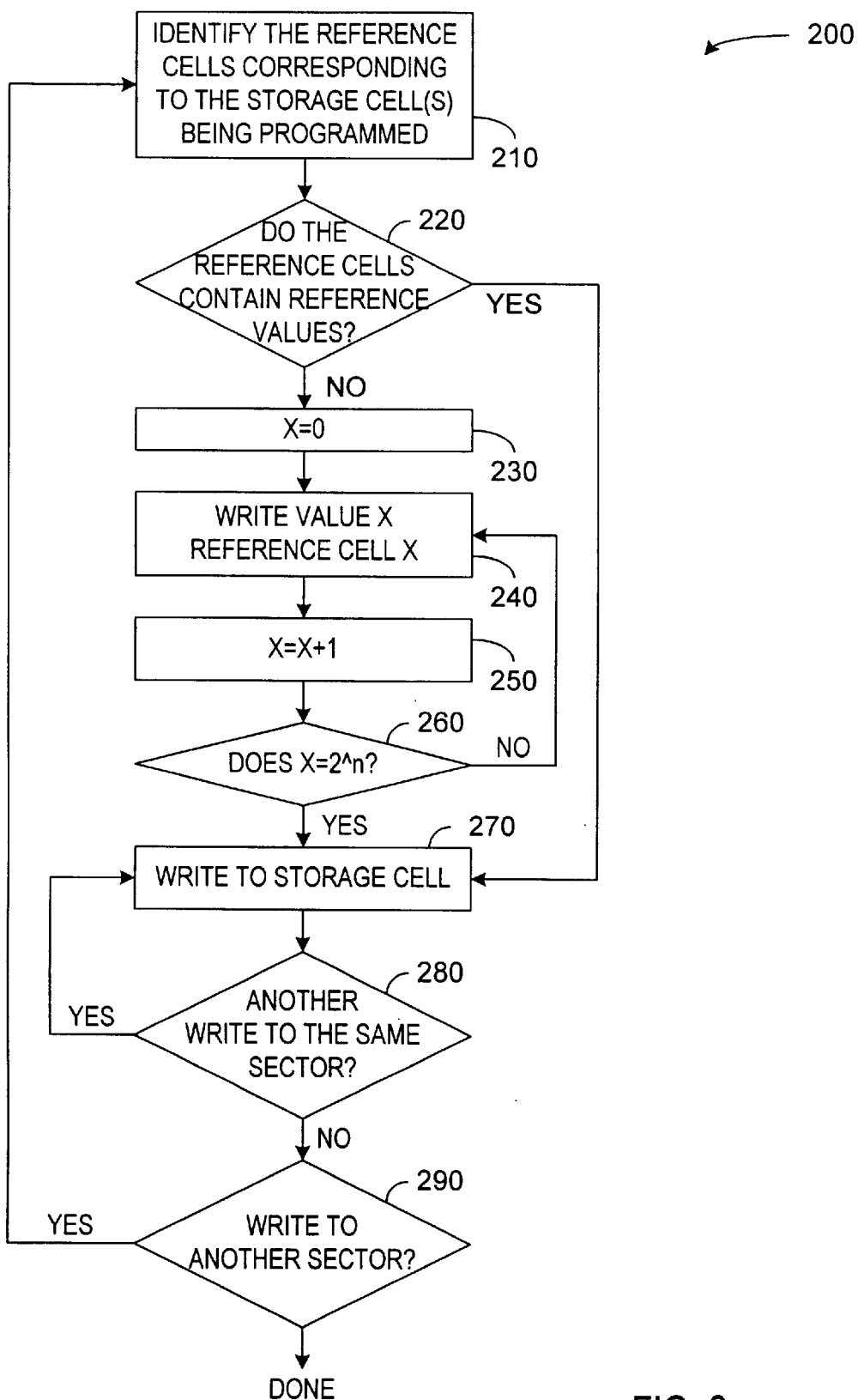
FIG. 2 is a flow diagram of a write process in accordance with an embodiment of the invention.

FIG. 2 is a flow diagram of a write process 200 in accordance with an embodiment of the invention. In an initial step 210, write process 200 identifies the reference cells associated with the storage cell or cell being written. In the exemplary embodiment of the invention, each sector of an array includes a set of $2^n$ reference cells 116. In a typical Flash memory where a sector contains 32K or 64K storage cells 118, sixteen reference cells 116 for a 4-bit-per-cell memory is a small fraction of the total number of memory cells, and timing overhead for use of reference cells 116 is also small. However, to reduce the number of reference cells 116, an entire array may include only a single set of $2^n$ reference cells, or memory 100 may include only one set of reference cells per Vt read circuit. Fewer reference cells may be sufficient because often variations in the output values from the Vt read circuit are associated with the Vt read circuit or common to an entire array, not a specific sector. Alternatively, each sector can include more than one set of reference cells 116 with each set of reference cells being associated with a particular portion of the sector containing the reference cells. Having more reference cells allows the physical locations of reference cell 116 to be closer to the associated storage cells 118 and allows the write times of reference values to be closer to the write times of the data values. Accordingly, with more reference cells 116, the reference cells 116 may better track the behavior of associated storage cells 118.

Step 220 determines whether the reference cells 116 associated with the storage cells 118 being read contain reference values. Write process 200 is best employed in a system for storage of block of data where a block of data is sequentially written to a sector. An example of such a system is a record and playback system that records an analog signal such as a sound or video signal as a series of digital sample. Another example is a digital mass data storage device such as a Flash memory card. In such a system, a sector including reference and storage cells is erased, before write process 200 begins, and step 220, which checks whether the reference cells contain reference values, is not required. The sector starts erased and is filled with reference and data values without intervening writes to other sectors. However, write process 200 can be more generally applied to random access writing where writing of values can move from sector to sector.

For the first time data is written to a sector after an erase of the sector, the reference cells 116 are in the erased state and do not contain reference values. Multiplexer 124 selects reference generator 122 as the source of reference values to be written. Step 230 and a loop including steps 240, 250, and 260 write the reference values in the reference cells 116 identified in step 210. In step 230, reference generator 122 initializes an index X for the sequential generation of consecutive digital values starting at zero. Alternatively, generation of reference values can be in any desired order provided that each value is written to the reference cell associated with the value. Step 240 writes value X to the reference cells 116 that associated with value X. In step 250, reference generator 122 increments index X before determining in step 260 whether the last reference value has been written to the last reference cell.

After writing the reference values, multiplexer 124 selects an input data signal DATA_IN as the source of data values written to storage cells 118. Data values are written to storage cells 118 using the same write process and write circuitry that write to reference cells 116. A step 270, which writes a multi-bit data value to a storage cell 118, is repeated as long as there are new data values to be written in the same sector. For a write operation writing an entire sector of 32K or 64K storage cells 118, the writing of reference values in reference cells 116 provides a minimal performance penalty. For a random access write of a data value, process 200 moves back to the initial step 210 of identifying the reference cells for the data value to be written if the data value to be written is not in the same sector as the data value last written to a storage cell 118. If reference values for the storage cell were previously written to the reference cells in the newly identified sector, the reference values do not need to be written.

Returning to FIG. 1, memory 100 includes a digital Vt read circuit 130, a content addressable memory 140, an encoder 150, and a read control circuit 138 that controls the read process. Digital Vt read circuit 130 can be any known read circuit that is capable reading the threshold voltage of a selected memory cell and generating a multi-bit digital value that corresponds to the threshold voltage of the selected memory cell. Further, in accordance with an aspect of the invention, the multi-bit digital value from Vt read circuit 130 includes more bits than do the values stored in the storage cells 118. For example, in the exemplary embodiment where each storage cell 118 stores a 4-bit data value, Vt read circuit 130 provides a 5-bit or 6-bit value indicating the threshold voltage read from a memory cell.

In FIG. 1, Vt read circuit 130 includes a local slow ramp generator 132 and a counter 134 which are coupled to row decoder 112 and sense amplifier 136. U.S. patent application Ser. No. 09/053,716, entitled "High Resolution Multi-Bit-Per-Cell Memory", filed Apr. 8, 1998, describes other suitable read circuits and is hereby incorporated by reference in its entirety. Slow ramp generator 132 generates a signal Vsr. which row decoder 112 applies to the control gate of the memory cell selected for a read (i.e., to the selected row line). Signal Vsr slowly changes voltage to cross the range of possible threshold voltages for memory cells. For reading the threshold voltage, counter 134 counts periods of a clock signal as signal Vsr moves across the threshold voltage range. When signal Vsr reaches the threshold voltage of the selected memory cell, sense amplifier 136 senses a change in the conductivity of the selected memory cell and stops counter 134 from counting further. The count from counter 134 provides a digital value indicating the threshold voltage of the selected memory cell.

Figure 3:
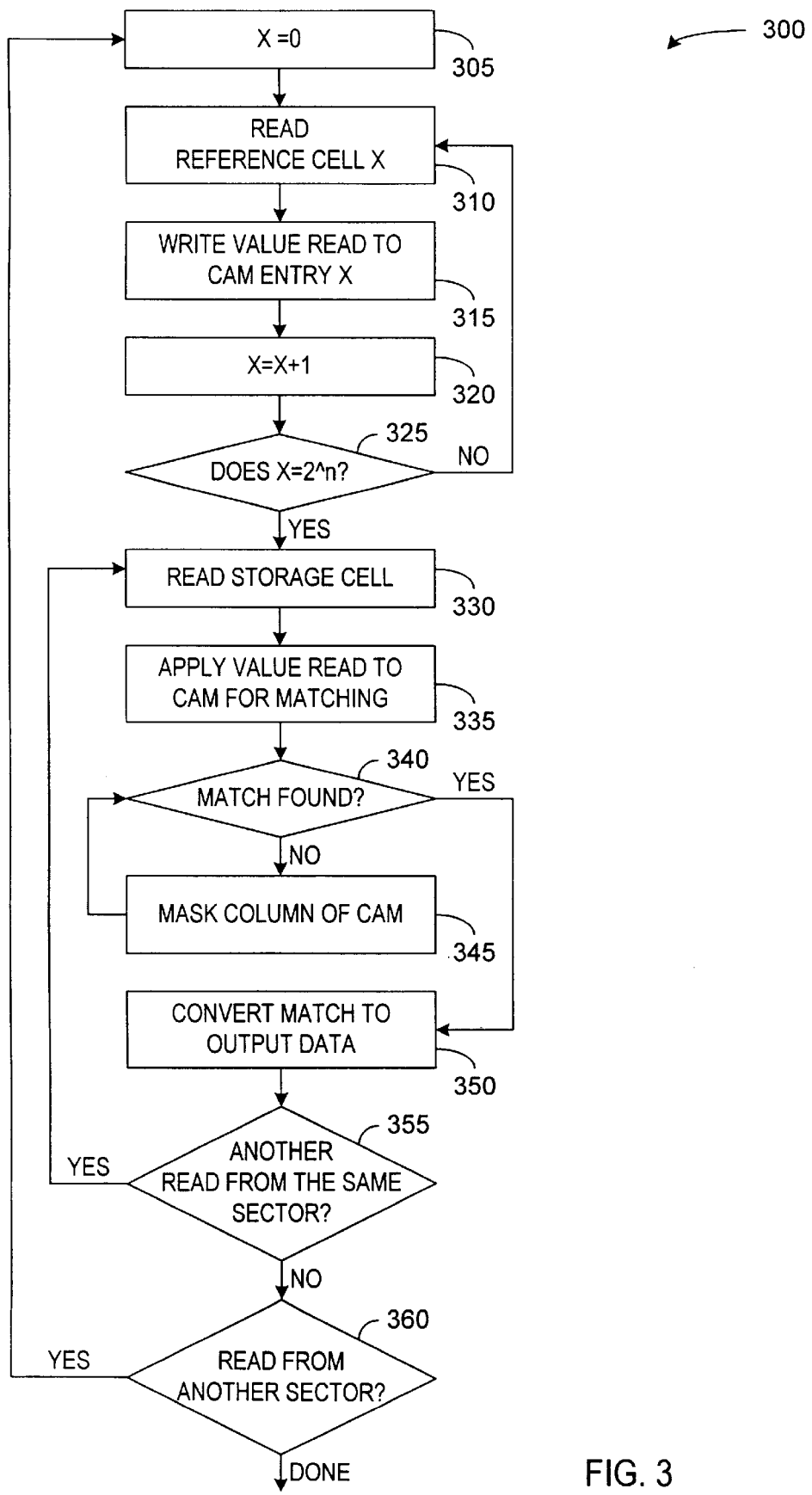
FIG. 3 is a flow diagram of a read process in accordance with an embodiment of the invention.

FIG. 3 is a flow diagram of an autotracking read process 300 in accordance with an embodiment of the invention. Process 300 starts in step 305 by initializing an index X for the address or location of the first reference cell 116 in a sector containing data to be read. Steps 310 and 315 respectively read the threshold voltage of the reference cell 116 that corresponds to index X and write the digital value read to a corresponding entry (or word) X in content addressable memory 140. After writing the digital value to CAM 140, step 320 increments index X, and a step 325 determines whether all of the reference values have been read. If not, steps 310 and 315 are repeated to read the reference cell 116 corresponding to the next value of index X. After a digital reference value from the last reference cell 116 in the sector has been written into the appropriate entry of CAM 140, process 300 transitions from step 325 to start reading storage cells 118.

Step 330 reads the selected storage cell 118 using Vt read circuit 130, and step 335 applies the value read to the CAM 140 for a match operation that locates an entry of CAM 140 containing a matching reference value. Typically, the value read from the storage cell 118 matches one of values in the entries of CAM. If there is a match, process 300 branches from decision step 340 to step 350 where encoder 150 generates the output data value. The output data has a value that corresponds to or identifies the entry of CAM 140 containing the matching value. Since Vt read circuit 140 provides digital values containing more bits than do the stored data, the value read may not exactly match any of the values in CAM 140. In this case, step 345 turns off or masks out a column of CAM 140 corresponding to the least significant bit of value read and the values stored in CAM 140. CAM 140 tests for a match in step 340. If no match is found again, step 345 turns off or masks out another column or bit of CAM 140 and continues turning off columns until a match is found or a data error is identified.

If another storage cell 118 in the same sector is to be read, the storage cell can be read without changing the content of CAM 140. Process 300 branches from a decision step 355 back to step 330 and reads another storage cell 118 from the current sector. Thus, when reading an entire sector, reading of the reference cells 116 minimally affects read performance. If the next storage cell 118 to be read is in another sector, read process 300 branches from a decision step 360 back to step 305 to read the reference cells from the new sector being accessed and reload CAM 140.

In embodiments of the invention having one set of reference cells per array 110, CAM 140 is reloaded only if the same Vt read circuit reads from the new array. Preferably, each array 110 has corresponding local read circuitry including a Vt read circuit and CAM 140, and the CAMs 140 are only loaded once per array. CAMs 140 can also be periodically loaded or refreshed if operating parameters may change during operation of a memory 100. For example, a match operation that fails to find a match in CAM 140 may signal a change in operating parameters. In response to a match operation failing to find a match, the reference cells 116 can be read and values read from reference cells 116 written to the associated CAM 140 before another match operation attempts to match the value read from a storage cell to the value from a reference cell 116.

Table 1 illustrates the variation in the content of CAM 140 for the exemplary embodiment of memory 100 where each storage cell stores four bits of data and the Vt read circuit provides a 6-bit digital signal. The variations of Table 1 are due to the clock signal for counter 134 having different frequencies, while the voltage of signal Vsr ramps at a constant rate independent of the clock signal's frequency. As illustrated in Table 1, variation in the frequency varies the count that the Vt read circuit reads for a reference cell or a storage cell. For example, when the Vt read circuit reads a storage cell 118 into which the value 8 was written, the count is 16 if the clock signal has the correct frequency f, if the clock signal is 25% fast, or 12 if the clock signal is 25% slow. However, the count read from a storage cell 118 when applied to CAM 140 matches the entry (or word) 8 for any of the clock frequencies. Other variations in the operating parameters and device characteristics of memory 100 can have similar effects on the value output from the Vt read circuit, but the final data output value from encoder 150 is independent of such variations.

TABLE 1

| Data Value | Look-up Value | Read Vt Value for Clock Frequency f | Read Vt Value for Frequency f + 25% | Read Vt Value for Frequency f − 25% |
| --- | --- | --- | --- | --- |
| 0 | 0000 | 000000b (0) | 000000b (0) | 000000b (0) |
| 1 | 0001 | 000010b (2) | 000010b (2) | 000001b (1) |
| 2 | 0010 | 000100b (4) | 000101b (5) | 000011b (3) |
| 3 | 0011 | 000110b (6) | 000111b (7) | 000101b (5) |
| 4 | 0100 | 001000b (8) | 001010b (10) | 000110b (6) |
| 5 | 0101 | 001010b (10) | 001100b (12) | 001000b (8) |
| 6 | 0110 | 001100b (12) | 001111b (15) | 001001b (9) |
| 7 | 0111 | 001110b (14) | 010001b (17) | 001011b (11) |
| 8 | 1000 | 010000b (16) | 010100b (20) | 001100b (12) |
| 9 | 1001 | 010010b (18) | 010110b (22) | 001110b (14) |
| 10 | 1010 | 010100b (20) | 011001b (25) | 001111b (15) |
| 11 | 1011 | 010110b (22) | 011011b (27) | 010001b (17) |
| 12 | 1100 | 011000b (24) | 011110b (30) | 010010b (18) |
| 13 | 1101 | 011010b (26) | 100000b (32) | 010100b (20) |
| 14 | 1110 | 011100b (28) | 100011b (35) | 010101b (21) |
| 15 | 1111 | 011110b (30) | 100101b (37) | 010111b (23) |

Table 1 also includes a column for the look-up value which indicates the output data value from encoder 150 when the value read from a storage cell matches the content of the associated CAM entry.

Figure 4A:
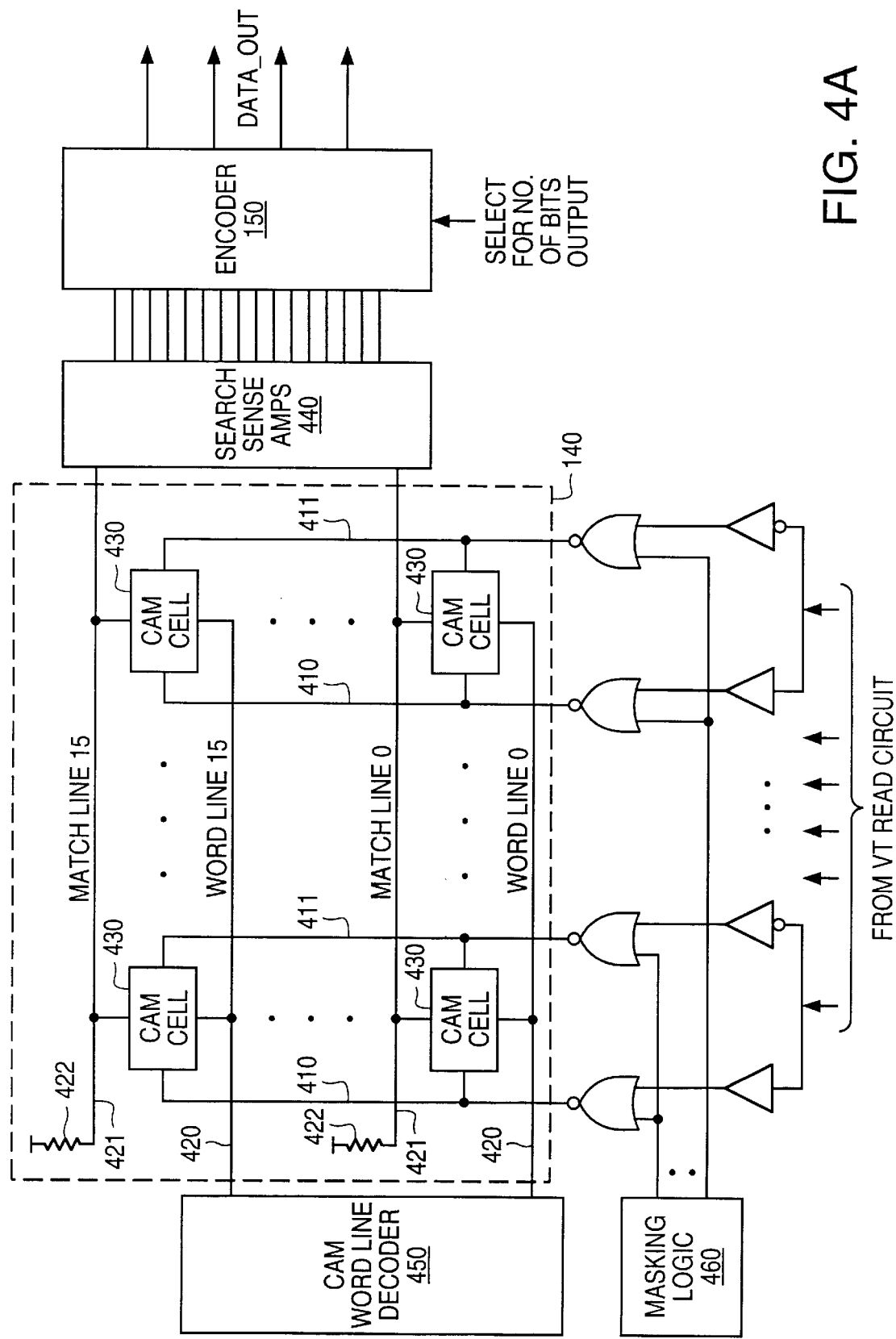
FIGS. 4A and 4B respectively show a content addressable memory and a CAM cell for the memory of FIG. 1.
Figure 4B:
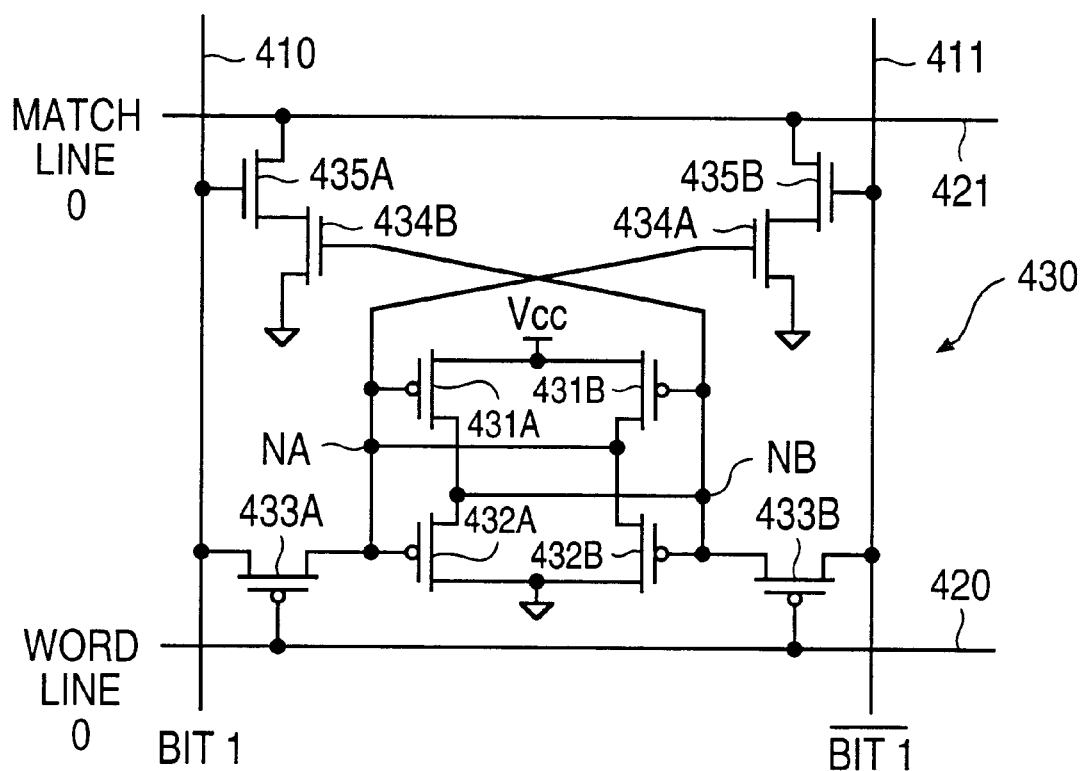

FIG. 4A illustrates an example of CAM 140 including sixteen rows of CAM cells 430. The embodiment of CAM 140 of FIGS. 4A and 4B is merely one example of an SRAM based binary CAM. Alternative CAM include but are not limited to ternary CAM (having a "don't care" state) or non-volatile Flash CAM. As shown in FIG. 4B, each CAM cell 430 has a pair of nodes NA and NB which are between respective pull-up transistors 431A and 431B and respective pull-down transistors 432A and 432B. The gates of transistors 431A and 432A are coupled to node NB, and the gates of transistors 431B and 432B are coupled to node NA. Pass transistors 433A and 433B in each CAM cell connect respective node NA and NB to respective bit lines 410 and 411 associated with a bit corresponding to the CAM cell 430. Pass transistors 433A and 433B have gates coupled to a word line 420 associated with a row including the CAM cell.

Each row of CAM 140 corresponds to an entries or word and includes N+M CAM cells. A write operation sets the polarity of the nodes NA in the CAM cells of an entry to the same binary states as a digital signal applied to the associated bit line 410. A binary signal on the complementary bit line 411 has the opposite binary state from the signal on bit line 410, and node NB has a binary state opposite that of node NA. (Bit lines 410 and 411 connect to the Vt read circuit through masking logic 460.) During a write to CAM 140, a digital signals (and its binary complement) representing a N+M-bit value to be written to CAM 140 is asserted to bit lines 410 (and 411), and a word line 420 corresponding to the entry being written is asserted. Pass transistors 435 and 436, which have gates coupled to the associated word line 420, connect respective nodes NA and NB to associated complementary bit lines 410 and 411. Each node NA charges to the state associated a bit being written to the CAM cell 430 before the signal on the selected word line 420 is deasserted. Pull-up transistors 431 and 432 and pull-down transistors 433 and 434 preserve the states of nodes NA and NB in each CAM cell after the associated word line is deasserted.

CAM 140 also includes match lines 421 where each match line 421 is associated with and coupled to the CAM cells 430 that forms an associated entry. Each match line 421 has a pull-up-resistor 422 which connects the match line 421 to a voltage such as supply voltage Vcc. In each CAM cell 430, transistors 435A and 434B in series and transistors 435B and 434A in series connect the associated match line 421 to ground. Transistors 434A and 434B have gates coupled to respective nodes NA and NB so that only the one of transistors 434A or 434B that corresponds to the node NA or NB in the high binary state conducts. For a match operation, binary signals representing the value to be matched are applied to bit lines 410 and 411. Transistors 435A and 435B have gates coupled to bit lines 410 and 411 respectively. A CAM cell 430 pulls down the associated match line 421 if both transistors 435A and 434B conduct or both transistors 435B and 434A conduct. This occurs when the bit represented on associated bit lines 410 and 411 does not correspond to the binary states of the nodes NA and NB in the CAM cell. Accordingly, if all of the input bits match the bits stored in the CAM cell of an entry, the match line 421 remains at high voltage. Sense amps 440 sense match lines 421 and assert a signal indicate which if any of the CAM entries stores a word matching the input data signal. Masking logic 460 can turn off or mask a column of CAM cells 430 during a match operation so that a match line 421 remaining high indicates that an input value matches all of the bits corresponding to columns that are not masked.

Encoder 150, which connects to sense amplifiers 440 of CAM 140, generates an N-bit digital output signal DATA_OUT identifying which of the match lines indicates a match. Data output signal DATA_OUT is independent of the variations in memory 100 for the reasons indicated above. In the embodiment of FIG. 4, encoder 150 is a look-up table that generates an N-bit digital output signal DATA_OUT. Such look-up tables can be implemented in hardwired logic gates, binary mask ROM, or re-writeable memory cells such as Flash memory cells or SRAM cells. With a re-writeable look-up table, the mapping between entries of CAM 140 and output data values can change. The mapping can reduce the number of output of bits per memory cell, for example, by mapping two or more entries to the same output data values. A signal can also select number of bits output from encoder 150 by causing encoder 150 to drop one or more of the bits that would otherwise be output.

Figure 6:
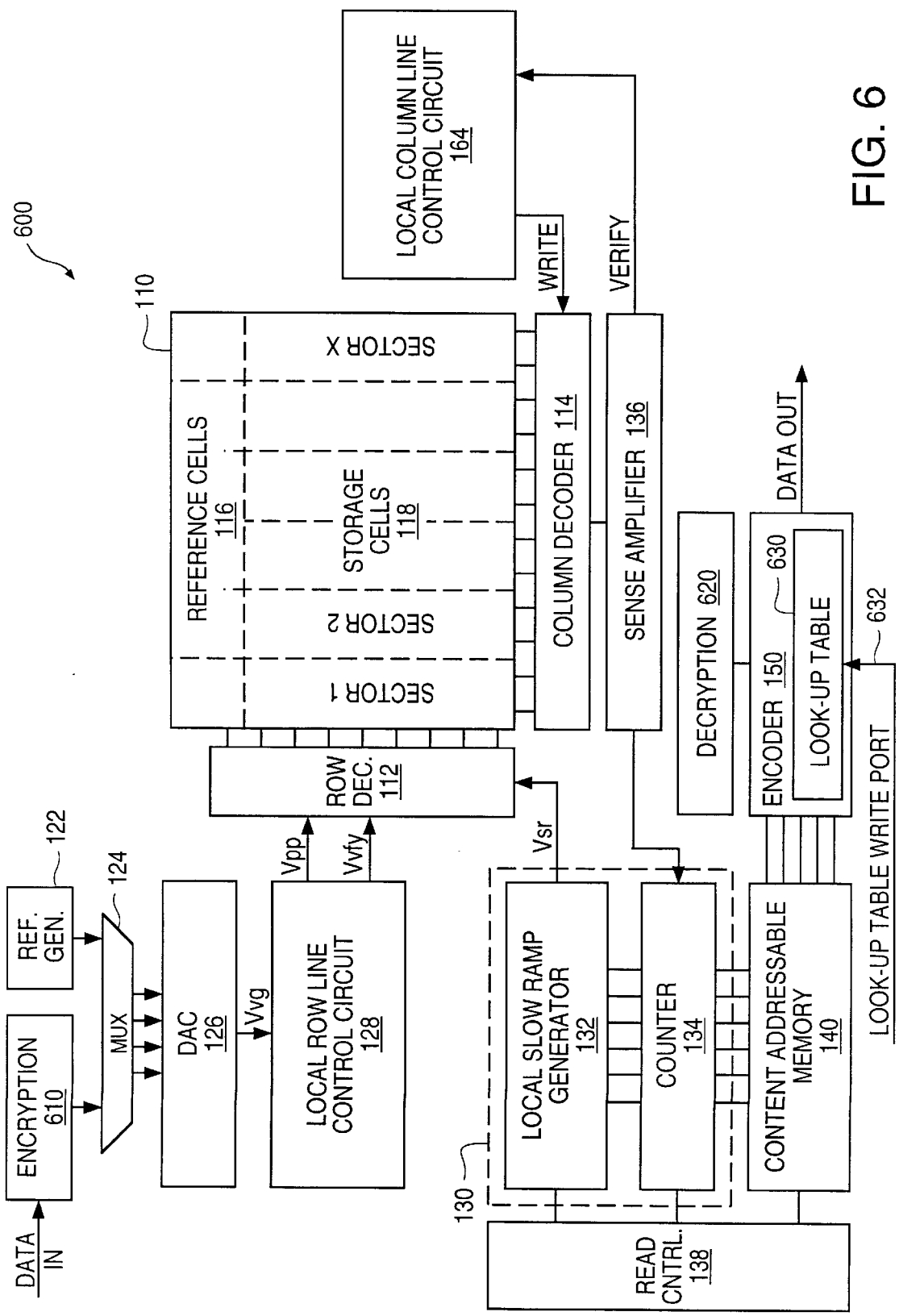
FIG. 6 is a block diagram of a non-volatile memory including data encryption and decryption in accordance with an embodiment of the invention.

A re-writeable look-up table in encoder 150 can also be change according to a user-provided encryption key for data decryption. FIG. 6 illustrates a memory 600 including data encryption and decryption in accordance with an embodiment of the invention. In memory 600, an encryption block 610 encrypts a data sequence that is stored in storage cells 118 during a write operation. Encryption block 610 can employ any type of logic that implements data encryption. For the encryption, a user provides an encryption key that controls how encryption block 610 encrypts the data. For a later read operation, a user similarly provides the encryption key to control a decryption block 620. Decryption block 620 changes encoder 150 by changing the contents of look-up table 630 during a read operation. Typically, the contents of look-up table 630 changes each time a storage cell 118 is read. If the user provides the correct key, encoder 150 changes encoding of each storage cell read as required to decrypt the data being read. If the key is not correct, the read operation fails to convert the encrypted data to the decrypted form. Accordingly, only users with the correct encryption key can read decrypted data from the memory. As an alternative to memory 600, encryption block 610 can be eliminated, and an external processor (not shown) can encrypt the data before a write operation. Similarly, decryption block 620 can be eliminated and the external processor can change the contents of look-up table 630 via a write port 632.

Figure 5:
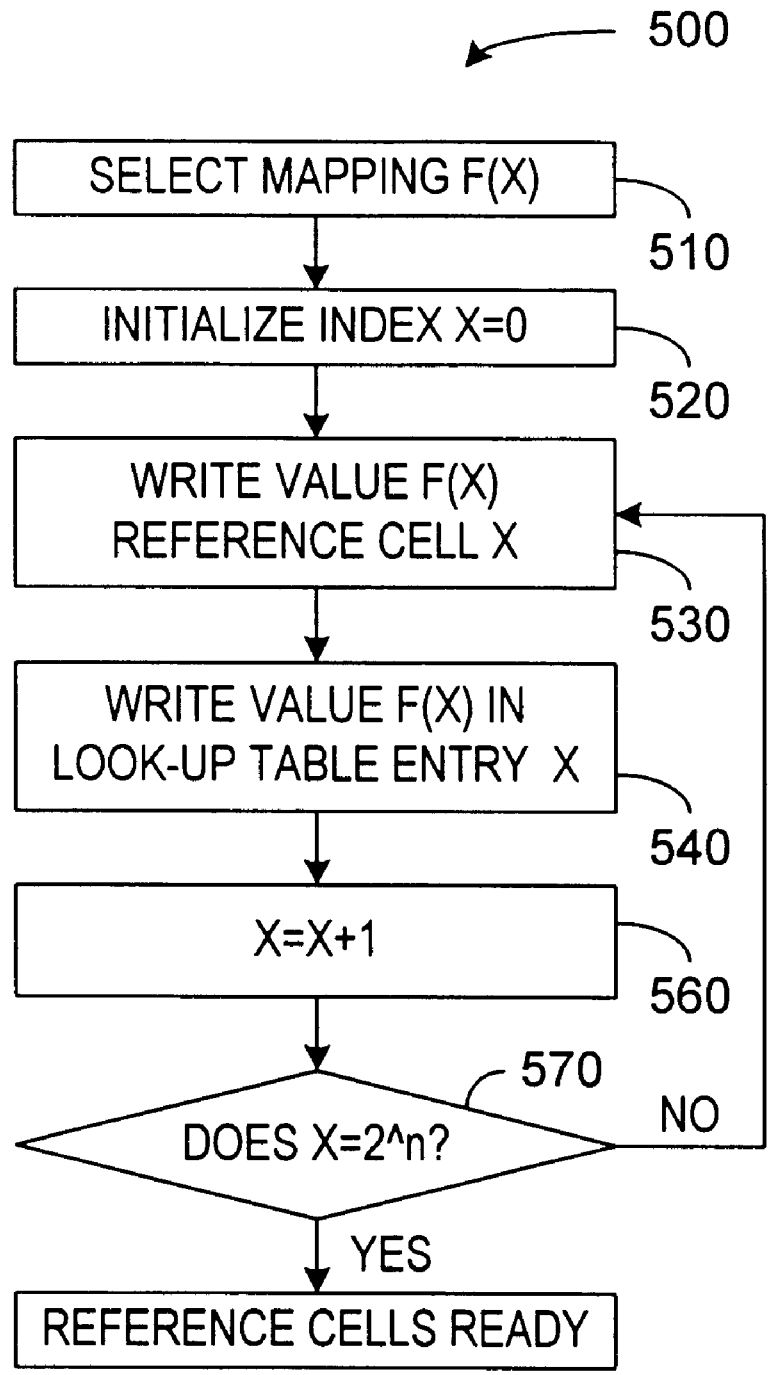
FIG. 5 is a flow diagram of a process for writing to reference cells in accordance with an embodiment of the invention.

As another use of a re-writeable look-up table, setting of the mapping in encoder 150 can be linked to the reference values written in reference cells 116. For example, the entry of CAM 140 that encoder maps to first data value is the entry that corresponded to reference cell storing the reference value associated with the first data value. Accordingly, even if the same threshold voltage levels always represent the same digital values, the association between a reference cell 116 and a reference value can change so that different threshold voltages are programmed into the reference cell. This helps avoid endurance problems associated with always programming a memory cell to the same threshold voltage level. FIG. 5 is a flow diagram of a process 500 that uses a programmable or re-writeable look-up table in encoder 150 to help randomized the threshold voltage programmed into reference cells 116. For process 500, an initial step 510 selects a mapping F from an address index X identifying a reference cell 116 and a reference value F(X) to be written in the identified reference cell. Mapping F can be any one-to-one function. In an exemplary embodiment, where reference values range from 0 to $2^N-1$, mapping F maps index X as indicated in Equation 1.

$$F(X)=(X+Y) \text{ modulo } 2^N \qquad \text{Equation 1}$$

The constant Y of Equation 1 can be stored in a binary storage associated with the look-up table. A step 520 initializes address index X for a loop including steps 530, 540, 550, and 560 which writes reference values in reference cells 116 and writes to the look-up table. In particular, step 530 programs the reference cell associated with address index X to the threshold voltage associated with the reference value F(X). Step 540 writes the reference value F(X) in digital form to a set of binary memory cells corresponding to entry X in the look-up table. Steps 560 and 570 respectively increment the address index X and determine whether the last reference value has been written. Changing the mapping F (e.g., incrementing constant Y) each time the reference values are written randomizes the programmed threshold voltages among the reference cells and improves the endurance of reference cells 116.

The processes described above for writing reference values in reference cells are not limited to use in memories employing CAMs to perform match operations. For example, a memory can compare an analog voltage representing the threshold voltage of a storage cell to analog voltages representing the threshold voltages of reference cells. Based on a matching of analog voltages an encoder can then output a multi-bit digital value. In such memories, if reference cells are erased and rewritten to provide better tracking, the endurance of the reference cells may be improved by periodically changing the mapping between digital values and threshold voltages (e.g., changing the operation of DAC 125 as described above) or periodically changing the mapping between digital values and reference cells as disclosed above in regard to FIG. 5.

Although the invention has been described with reference to a particular embodiment, the description is only an example of the invention's application and should not be taken as a limitation. Various adaptations and combinations of features disclosed are within the scope of the invention as defined by the following claims.

I claim:

1. A multi-bit-per-cell memory comprising:
   an array of memory cells which includes reference cells and storage cells;
   a read circuit connected to the array, wherein the read circuit selects and reads any memory cell from the array;
   a content addressable memory coupled to the read circuit, wherein the content addressable memory is coupled to store reference values that the read circuit reads from the reference cells and perform match operations on values that the read circuit reads from the storage cells; and
   an encoder coupled to the content addressable memory, the encoder generating an output data value indicating which entry in the content addressable memory is identified as a match during the match operation.

2. The memory of claim 1, wherein the memory cells are non-volatile memory cells.

3. The memory of claim 2, wherein the read circuit reads the memory cell by generating a digital value corresponding to a threshold voltage of the memory cell.

4. The memory of claim 3, wherein the read circuit comprises:
   a ramp circuit that generates a read signal for application to a control gate of a selected memory cell selected for a read operation, the read signal having a voltage that moves across a range permitted for a threshold voltage of the selected memory cell;
   a sense amplifier coupled to sense a change in conductivity of the selected memory cell; and
   a counter that counts periods of a clock signal between the ramp circuit beginning to move the voltage of the read signal and the sense amplifier sensing the change in conductivity, a count from the counter indicating the threshold voltage of the selected memory cell.

5. The memory of claim 1, wherein when reading a memory cell, the read circuit generates a digital value containing more bits than are in the output data value.

6. The memory of claim 1, wherein the array of memory cells is a Flash memory array containing multiple erasable sectors, and each sector contains storage cells and a set of the reference cells.

7. The memory of claim 1, further comprising a plurality of arrays of memory cells which includes reference cells and storage cells.

8. The memory of claim 7, wherein for each of the array, the memory further comprises a local read circuit connected to the array, wherein the local read circuit selects and reads any memory cell from the array.

9. The memory of claim 8, wherein for each read circuit, the memory further comprises:
   a content addressable memory coupled to the local read circuit, wherein the content addressable memory is coupled to store reference values that the local read circuit reads from the reference cells and perform match operations on values that the local read circuit reads from the storage cells; and
   an encoder coupled to the content addressable memory, the encoder generating an output data value indicating which entry in the content addressable memory is identified as a match during the match operation.

10. The memory of claim 1, wherein the encoder comprises a look-up table containing re-programmable memory cells.

11. The memory of claim 1, wherein the encoder comprises a re-writeable look-up table that controls the output data values indicated for each entry in the content addressable memory.

12. A method for operating a multi-bit-per-cell memory, comprising:
    reading a first set of reference values from a first set of reference cells;
    writing the first set of reference values to entries in a content addressable memory;
    reading a first multi-bit digital value from a first storage cell;
    using the content addressable memory to determine which of the entries stores a reference value that matches the first multi-bit digital value; and
    generating an output data signal having a first value that identifies the entry determined to match the first multi-bit digital value.

13. The method of claim 12, further comprising:
    erasing a sector of memory cells in the memory, wherein the memory cells in the sector include the first set of reference cells and storage cells including the first storage cell;
    programming the first set of reference cells to levels indicating the first set of reference values; and
    programming the storage cells in the sector, wherein
       programming the reference cells and programming the storage cells are conducted without other intervening operations of the memory.

14. The method of claim 13, wherein programming the reference cells immediately follows programming the storage cells.

15. The method of claim 13, wherein programming the storage cells immediately follows programming the reference cells.

16. The method of claim 12, further comprising:
    reading a second multi-bit digital value from a second storage cell;
    using the content addressable memory to determine which of the entries stores a reference value that matches the second multi-bit digital value; and
    generating a second output data signal having a value that identifies the entry determined to match the second multi-bit digital value.

17. The method of claim 16, wherein using the content addressable memory to determine which of the entries stores the reference value that matches the second multi-bit digital value uses the first set of reference values which was stored in the content addressable memory.

18. The method of claim 12, further comprising:
    reading a second set of reference values from a second set of reference cells;
    writing the second set of reference values to the entries of the content addressable memory;
    reading a second multi-bit digital value from a second storage cell;
    using the content addressable memory to determine which of the entries stores a reference value that matches the second multi-bit digital value; and
    generating a second output data signal having a value that identifies to the entry determined to match the second multi-bit digital value.

19. The method of claim 12, wherein generating the output data signal comprises using a match signal from the content addressable memory to select a value from a look-up table, wherein the output data signal represents the value from the look-up table.

20. The method of claim 19, further comprising writing values to the look-up table, wherein the values written to the look-up table are selected according to a decryption key and an encryption method used when storing data in storage cells.

21. A method for operating a multi-bit-per-cell non-volatile memory, comprising:

performing a first write operation that writes a set of reference values to a set of reference cells in the memory, wherein for the first write operation, a first mapping maps threshold voltages to the reference values, and the first write operation programs each reference cell to the threshold voltage that the first mapping maps to the reference value written in the reference cell;

erasing the reference cells; and performing a second write operation that writes the set of reference values to the set of reference cells, wherein for the second write operation, a second mapping maps threshold voltages to the reference value, and writing programs each reference cell to the threshold voltage that the second mapping maps to the reference value written in the reference cell.

22. The method of claim 21, wherein each reference values in the set correspond to a different multi-bit value that can be written in a single memory cell.

23. The method of claim 21, further comprising:

reading the reference cells;

reading a storage cell;

comparing a result from reading the storage cell with results from reading the reference cells; and generating an output value representing a multi-bit data read from the storage cell, wherein the output value is selected according to which result from reading the reference cells matches the result from reading the storage cell.

24. The method of claim 23, wherein a content addressable memory performs the comparing.

25. A method for operating a multi-bit-per-cell non-volatile memory, comprising:

writing a set of reference values to a set of reference cells in the memory, wherein a first mapping maps the reference values to the reference cells, and the writing programs each reference cell to a threshold voltage associated with the reference value that the first mapping maps to the reference cell;

writing the reference values to entries in a look-up table, wherein each entry comprises binary memory cells and corresponds to one of the reference cell, and the reference value written in an entry is the reference value that the first mapping maps to the reference cell corresponding to the entry;

reading the reference cells;

reading a storage cell;

comparing a result from reading the storage cell with results from reading the reference cells; and generating an output value representing a multi-bit data read from the storage cell, wherein the output value is the reference value read from the entry that corresponds to the reference cell providing a result matching the result from the storage cell.

26. The method of claim 25, further comprising:

erasing the reference cells;

re-writing the set of reference values to the set of reference cells, wherein a second mapping maps the reference values to the reference cells, and this re-writing programs each reference cell to a threshold voltage associated with the reference value that the second mapping maps to the reference cell; and re-writing the reference values to the entries in the look-up table, wherein the reference value re-written in an entry is the reference value that the second mapping maps to the reference cell corresponding to the entry.

27. A method for operating a multi-bit-per-cell memory, comprising:

(a) writing an encrypted data sequence to storage cells in the memory;

(b) storing values in a content addressable memory;

(c) reading a selected one of the storage cells and applying a result from the reading to the content addressable memory for a match operation;

(d) applying a match signal from the content addressable memory to a look-up table, wherein the match signal selects an entry of the look-up table, the selected entry corresponding to an entry in the content addressable memory that matches the applied result from reading the selected storage cell; and (f) outputting a value from the selected entry of the look-up table, wherein the values in the look-up table are selected for decrypting data read from the selected storage cell.

28. The method of claim 27, further comprising writing reference values to reference cells in the memory; and reading the reference cells, wherein storing the values stores results from the reading of the reference cells in the content addressable memory.

29. The method of claim 27, further comprising changing the values in the look-up table to new values, wherein the new values in the look-up table are selected for decrypting data read from a next storage cell storing encrypted data;

selecting the next storage cell as the selected storage cell; and repeating steps (c) through (f).

30. The method of claim 29, wherein the values stored in the look-up table and the new values stored in the look-up table are determined from a user-provided encryption key.

* * * * *